(12) United States Patent
Han et al.

(10) Patent No.: US 12,170,067 B2
(45) Date of Patent: Dec. 17, 2024

(54) GATE DRIVING CIRCUIT AND DISPLAY DEVICE

(71) Applicant: LG Display Co., Ltd., Seoul (KR)

(72) Inventors: Ingu Han, Yangsan-si (KR); HongJae Shin, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/054,866

(22) Filed: Nov. 11, 2022

(65) Prior Publication Data

US 2023/0215377 A1 Jul. 6, 2023

(30) Foreign Application Priority Data

Dec. 31, 2021 (KR) .................. 10-2021-0193711

(51) Int. Cl.
*G09G 3/3266* (2016.01)
*G09G 3/3233* (2016.01)

(52) U.S. Cl.
CPC ......... *G09G 3/3266* (2013.01); *G09G 3/3233* (2013.01); *G09G 2300/0842* (2013.01); *G09G 2320/0626* (2013.01)

(58) Field of Classification Search
CPC ............... G09G 3/3266; G09G 3/3233; G09G 2300/0842; G09G 2320/0626; G09G 3/32; G09G 3/20; G09G 3/3225; G09G 3/2074; G09G 2300/0819; G09G 2300/0861; G09G 2310/0267; G09G 2310/0286; G09G 2310/0291; G09G 2310/08; G11C 19/28
See application file for complete search history.

(56) References Cited

U.S. PATENT DOCUMENTS

| | | | | |
|---|---|---|---|---|
| 2010/0328281 | A1* | 12/2010 | Okada ................. | G11C 19/184 345/206 |
| 2015/0109276 | A1* | 4/2015 | Gupta .................. | G09G 3/3266 345/82 |
| 2015/0109279 | A1* | 4/2015 | Gupta .................. | G09G 3/3266 345/82 |
| 2016/0133185 | A1* | 5/2016 | Yoon .................... | G09G 3/3233 345/76 |
| 2016/0351128 | A1* | 12/2016 | Li ......................... | G11C 19/28 |
| 2020/0043404 | A1* | 2/2020 | Yu ........................ | G09G 3/3266 |

FOREIGN PATENT DOCUMENTS

KR 2021006186 A 5/2021

* cited by examiner

*Primary Examiner* — Stephen G Sherman
(74) *Attorney, Agent, or Firm* — Seed IP Law Group LLP

(57) ABSTRACT

Embodiments of the present disclosure are related to a gate driving circuit and a display device, by a boot capacitor controlling a voltage level of a Q node at a timing that the gate driving circuit outputs a gate signal of a turn-on level and a pump capacitor controlling the voltage level of the Q node in a period that the gate signal of the turn-on level is output, a level of the gate signal can be maintained stably even in the case that the gate signal of the turn-on level is output in a long time.

17 Claims, 8 Drawing Sheets

<EX 1>

<EX 2>

GATE DRIVING CIRCUIT AND DISPLAY DEVICE

CROSS REFERENCE TO RELATED APPLICATION

This application claims priority to Korean Patent Application No. 10-2021-0193711, filed on Dec. 31, 2021, which is hereby incorporated by reference for all purposes as if fully set forth herein.

BACKGROUND

Technical Field

Embodiments of the present disclosure are related to a gate driving circuit and a display device.

Description of Related Art

Display devices can include a plurality of subpixels disposed in a display panel and various circuits driving the plurality of subpixels.

The display devices, for example, can include a gate driving circuit controlling a driving timing of the plurality of subpixels and a data driving circuit supplying a data voltage corresponding to an image data to the plurality of subpixels.

In a case that an output signal by the gate driving circuit controlling the driving timing of the subpixel is not supplied to the subpixel normally, an abnormality of driving of the subpixel can be occurred. By this, a quality of an image that the display panel displays can be degenerated.

BRIEF SUMMARY

Embodiments of the present disclosure can provide a display device being capable of stably maintaining an output signal that a gate driving circuit supplies to a subpixel disposed in a display panel and improving a driving characteristic of the display panel.

Embodiments of the present disclosure can provide a display device including a display panel in which a plurality of subpixels are disposed, a plurality of gate lines electrically connected to at least one of the plurality of subpixels, and a gate driving circuit outputting a gate signal to the plurality of gate lines, wherein the gate driving circuit includes a pull-up transistor controlled by a voltage level of a Q node, a pull-down transistor controlled by a voltage level of a QB node, a pump capacitor electrically connected between the Q node and an input terminal of a gate clock signal, and a pump transistor electrically connected between the pump capacitor and the Q node and controlled by the gate signal output to the gate line.

Embodiments of the present disclosure can provide a display device including a plurality of subpixels disposed in a display panel, a first gate driving circuit outputting a first gate signal to the plurality of subpixels, and a second gate driving circuit outputting a second gate signal to the plurality of subpixels, wherein in one frame period, a period that the second gate signal is a turn-on level is greater than a period that the first gate signal is a turn-on level, and wherein the second gate driving circuit includes a pump control portion electrically connected between a Q node and an input terminal of a gate clock signal and controlled by a voltage level of the second gate signal.

Embodiments of the present disclosure can provide a gate driving circuit including a pull-up transistor controlled by a voltage level of a Q node and electrically connected between an input terminal of a first gate driving voltage and an output terminal of a gate signal, a pull-down transistor controlled by a voltage level of a QB node and electrically connected between an input terminal of a second gate driving voltage and the output terminal of the gate signal, a pump capacitor electrically connected between the Q node and an input terminal of a gate clock signal, a pump transistor electrically connected between the pump capacitor and the Q node, and a feed transistor electrically connected between a gate node of the pump transistor and the input terminal of the first gate driving voltage, and controlled by a voltage level of the gate signal.

According to various embodiments of the present disclosure, as maintaining a voltage level of a Q node included in a gate driving circuit in a constant range by using a gate signal controlling a light-emitting period of a subpixel, a performance of the gate driving circuit can be improved while maintaining a level of the gate signal output in the light-emitting period stably.

BRIEF DESCRIPTION OF THE SEVERAL VIEWS OF THE DRAWINGS

The above and other benefits, features, and advantages of the present disclosure will be more clearly understood from the following detailed description, taken in conjunction with the accompanying drawings, in which.

DETAILED DESCRIPTION

Figure 1:
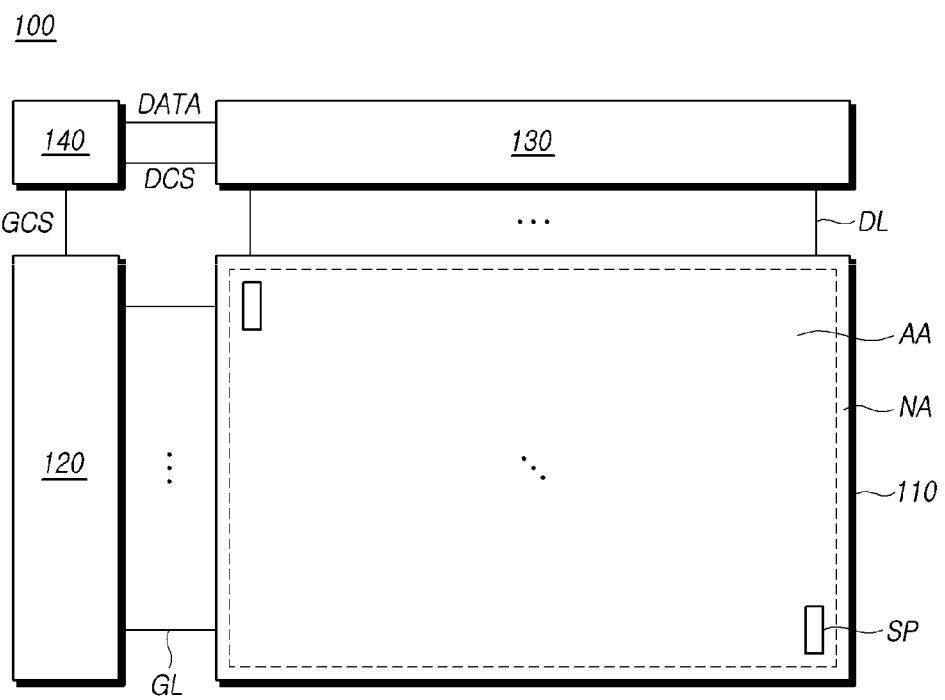
FIG. 1 is a diagram schematically illustrating a configuration of a display device according to embodiments of the present disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein may be omitted when it is determined that the description may make the subject matter in some embodiments of the present disclosure rather unclear. The terms such as "including," "having," "containing," "constituting" "make up of," and "formed of" used herein are generally intended to allow other components to be added unless the terms are used with the term "only." As used herein, singular forms are intended to include plural forms unless the context clearly indicates otherwise.

Terms, such as "first," "second," "A," "B," "(A)," or "(B)" may be used herein to describe elements of the present disclosure. Each of these terms is not used to define essence, order, sequence, or number of elements, etc., but is used merely to distinguish the corresponding element from other elements.

When it is mentioned that a first element "is connected or coupled to," "contacts or overlaps," etc., a second element, it should be interpreted that, not only can the first element "be directly connected or coupled to" or "directly contact or overlap" the second element, but a third element can also be "interposed" between the first and second elements, or the first and second elements can "be connected or coupled to," "contact or overlap," etc., each other via a fourth element. Here, the second element may be included in at least one of two or more elements that "are connected or coupled to," "contact or overlap," etc., each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes, etc., are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, various embodiments of the present disclosure will be described in detail with reference to accompanying drawings.

FIG. 1 is a diagram schematically illustrating a configuration of a display device 100 according to embodiments of the present disclosure.

Referring to FIG. 1, the display device 100 can include a display panel 110, and a gate driving circuit 120, a data driving circuit 130 and a controller 140 for driving the display panel 110.

The display panel 110 can include an active area AA where a plurality of subpixels SP is disposed, and a non-active area which is located outside the active area AA.

A plurality of gate lines GL and a plurality of data lines DL can be arranged on the display panel 110. The plurality of subpixels SP can be located in areas where the gate lines GL and the data lines DL intersect each other.

The gate driving circuit 120 is controlled by the controller 140, and sequentially outputs scan signals to the plurality of gate lines GL arranged on the display panel 110, thereby controlling the driving timing of the plurality of subpixels SP.

The gate driving circuit 120 can include one or more gate driver integrated circuits GDIC, and can be located only at one side of the display panel 110, or can be located at both sides thereof according to a driving method.

Each gate driver integrated circuit GDIC can be connected to a bonding pad of the display panel 110 by a tape automated bonding TAB method or a chip-on-glass COG method. Alternatively, each gate drive integrated circuit GDIC can be implemented by a gate-in-panel GIP method to then be directly arranged on the display panel 110. Alternatively, the gate driver integrated circuit GDIC can be integrated and arranged on the display panel 110. Alternatively, each gate driver integrated circuit GDIC can be implemented by a chip-on-film COF method in which an element is mounted on a film connected to the display panel 110.

The data driving circuit 130 receives image data DATA from the controller 140 and converts the image data DATA into an analog data voltage Vdata. Then, the data driving circuit 130 outputs the data voltage Vdata to each data line DL according to the timing at which the scan signal is applied through the gate line GL so that each of the plurality of subpixels SP emits light having brightness according to the image data DATA.

The data driving circuit 130 can include one or more source driver integrated circuits SDIC.

Each source driver integrated circuit SDIC can include a shift register, a latch circuit, a digital-to-analog converter, an output buffer, and the like.

Each source driver integrated circuit SDIC can be connected to a bonding pad of the display panel 110 by a tape automated bonding TAB method or a chip-on-glass COG method. Alternatively, each source driver integrated circuit SDIC can be directly disposed on the display panel 110. Alternatively, the source driver integrated circuit SDIC can be integrated and arranged on the display panel 110. Alternatively, each source driver integrated circuit SDIC can be implemented by a chip-on-film COF method. In this case, each source driver integrated circuit SDIC can be mounted on a film connected to the display panel 110, and can be electrically connected to the display panel 110 through wires on the film.

The controller 140 can supply various control signals to the gate driving circuit 120 and the data driving circuit 130, and control the operation of the gate driving circuit 120 and the data driving circuit 130.

The controller 140 can be mounted on a printed circuit board, a flexible printed circuit, or the like, and can be electrically connected to the gate driving circuit 120 and the data driving circuit 130 through the printed circuit board, the flexible printed circuit, or the like.

The controller 140 can allow the gate driving circuit 120 to output a scan signal according to the timing implemented in each frame. The controller 140 can convert a data signal received from the outside to conform to the data signal format used in the data driving circuit 130 and then output the converted image data to the data driving circuit 130.

The controller 140 receives, from the outside (e.g., a host system), various timing signals including a vertical synchronization signal VSYNC, a horizontal synchronization signal HSYNC, an input data enable DE signal, a clock signal CLK, and the like, as well as the image data.

The controller 140 can generate various control signals using various timing signals received from the outside, and can output the control signals to the gate driving circuit 120 and the data driving circuit 130.

For example, in order to control the gate driving circuit 120, the controller 140 can output various gate control signals GCS including a gate start pulse GSP, a gate shift clock GSC, a gate output enable signal GOE, or the like.

The gate start pulse GSP controls operation start timing of one or more gate driver integrated circuits GDIC constituting the gate driving circuit 120. The gate shift clock GSC, which is a clock signal commonly input to one or more gate driver integrated circuits GDIC, controls the shift timing of a scan signal. The gate output enable signal GOE specifies timing information on one or more gate driver integrated circuits GDIC.

In addition, in order to control the data driving circuit 130, the controller 140 can output various data control signals DCS including a source start pulse SSP, a source sampling clock SSC, a source output enable signal SOE, or the like.

The source start pulse SSP controls a data sampling start timing of one or more source driver integrated circuits SDIC constituting the data driving circuit 130. The source sampling clock SSC is a clock signal for controlling the timing of sampling data in the respective source driver integrated circuits SDIC. The source output enable signal SOE controls the output timing of the data driving circuit 130.

The display device 100 can further include a power management integrated circuit for supplying various voltages or currents to the display panel 110, the gate driving circuit 120, the data driving circuit 130, and the like or controlling various voltages or currents to be supplied thereto.

Each subpixel SP is an area defined by a cross of the gate line GL and the data line DL, and at least one circuit element including an element emitting a light can be disposed in the subpixel SP.

For example, in a case that the display device 100 is an organic light-emitting display device, an organic light-emitting diode OLED and various circuit elements can be disposed on the plurality of subpixels SP. As controlling a current supplied to the organic light-emitting diode OLED by the various circuit elements, each subpixel SP can represent a luminance corresponding to an image data.

Alternatively, in some cases, a light-emitting diode LED, or a micro light-emitting diode μLED can be disposed on the subpixel SP.

Figure 2:
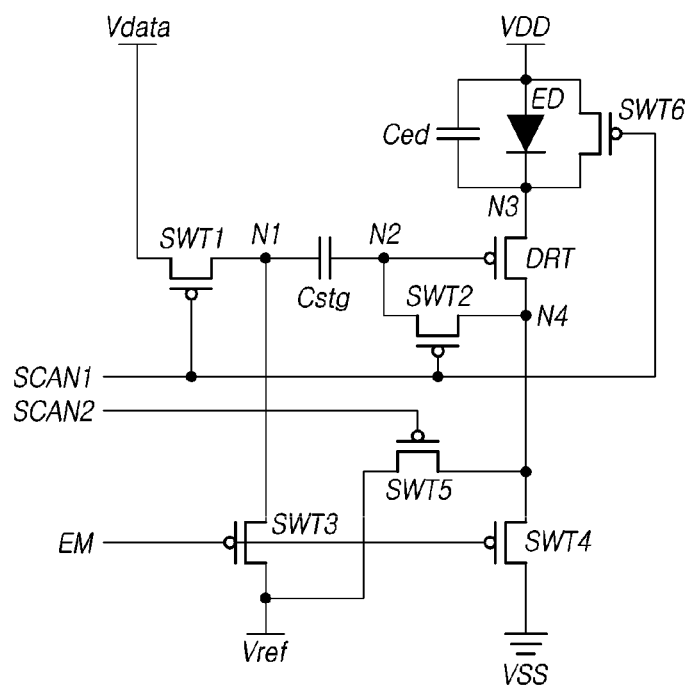
FIG. 2 is a diagram illustrating an example of a circuit structure of a subpixel included in a display device according to embodiments of the present disclosure.

FIG. 2 is a diagram illustrating an example of a circuit structure of the subpixel SP included in the display device 100 according to embodiments of the present disclosure.

Referring to FIG. 2, each of the plurality of subpixels SP disposed in the display panel 110 can include a light-emitting element ED. The subpixel SP can include a driving transistor DRT driving the light-emitting element ED.

The light-emitting element ED, for example, can be electrically connected between a voltage line being supplied a first driving voltage VDD and a third node N3. The first driving voltage VDD, for example, can be a high-potential driving voltage. The third node N3 can be a source node or a drain node of the driving transistor DRT.

The subpixel SP can include at least one transistor and at least one capacitor other than the light-emitting element ED and the driving transistor DRT.

For example, the subpixel SP can include six transistors SWT1, SWT2, SWT3, SWT4, SWT5, SWT6. The subpixel SP can include a storage capacitor Cstg and a light-emitting element capacitor Ced.

FIG. 2 illustrates an example of a circuit structure of the subpixel SP. The number of transistors, capacitors and signal lines (e.g., gate lines) included in the subpixel SP and a connection structure thereof can be various. For example, the subpixel SP could further comprise a sensing line and a sensing transistor. Furthermore, FIG. 2 illustrates an example that transistors included in the subpixel SP is a P type, but at least some of transistors included in the subpixel SP can be N type. When the at least some of transistors included in the subpixel SP are N type, the configurations and operations described below could be modified correspondingly. These modified configurations and operations also fall in the scope of the present application.

A first switching transistor SWT1 can be electrically connected between the data line DL being supplied the data voltage Vdata and a first node N1. The first switching transistor SWT1 can be controlled by a first scan signal SCAN1 supplied through the gate line GL.

A second switching transistor SWT2 can be electrically connected between a second node N2 and a fourth node N4. The second node N2 can be a gate node of the driving transistor DRT. The fourth node N4 can be the drain node or the source node of the driving transistor DRT. The second switching transistor SWT2 can be controlled by the first scan signal SCAN1 supplied through the gate line GL.

A third switching transistor SWT3 can be electrically connected between a voltage line being supplied a reference voltage Vref and the first node N1. The third switching transistor SWT3 can be controlled by a light-emitting control signal EM supplied through the gate line GL.

A fourth switching transistor SWT4 can be electrically connected between a voltage line being supplied a second driving voltage VSS and the fourth node N4. The fourth switching transistor SWT4 can be controlled by the light-emitting control signal supplied through the gate line GL.

A fifth switching transistor SWT5 can be electrically connected between the voltage line being supplied the reference voltage Vref and the fourth node N4. The fifth switching transistor SWT5 can be controlled by a second scan signal SCAN2 supplied through the gate line GL.

A sixth switching transistor SWT6 can be electrically connected between the voltage line being supplied the first driving voltage VDD and the third node N3. The sixth switching transistor SWT6 can be controlled by the first scan signal SCAN1 supplied through the gate line GL.

The storage capacitor Cstg can be electrically connected between the first node N1 and the second node N2. The light-emitting element capacitor Ced can be electrically connected between the voltage line being supplied the first driving voltage VDD and the third node N3. The light-emitting element capacitor Ced can be a capacitor intentionally disposed outside of the light-emitting element or can mean a capacitor inside of the light-emitting element ED.

The switching transistor SWT can be controlled by the scan signal SCAN and the light-emitting control signal EM supplied through the gate line GL and the light-emitting element ED can be driven.

For example, the switching transistor SWT can be turned-on according to timings at which the first scan signal SCAN1 and the second scan signal SCAN2 are supplied. A timing at which the first scan signal SCAN1 is supplied can be different from a timing at which the second scan signal SCAN2 is supplied. For example, the timing at which the second scan signal SCAN2 is supplied can be before the timing at which the first scan signal SCAN1 is supplied. The second scan signal SCAN2 can be the scan signal SCAN output at a timing for a driving of a previous gate line GL.

When the second scan signal SCAN2 is supplied, the fifth switching transistor SWT5 can be turned-on. The reference voltage Vref can be supplied to the fourth node N4, and the fourth node N4 can be initialized.

A period that the second scan signal SCAN2 of a turn-on level is supplied can be referred to as "an initialization period".

When the first scan signal SCAN1 is supplied, the first switching transistor SWT1, the second switching transistor SWT2 and the sixth switching transistor SWT6 can be turned-on.

As the first switching transistor SWT1 is turned-on, the data voltage Vdata can be applied to the first node N1. As the second switching transistor SWT2 and the sixth transistor SWT6 are turned-on, a voltage that a threshold voltage of the driving transistor DRT is reflected to the first driving voltage VDD can be applied to the second node N2.

A period that the first scan signal SCAN1 of a turn-on level is supplied can be referred to as "a data writing period".

When the light-emitting signal EM is supplied, the third switching transistor SWT3 and the fourth switching transistor SWT4 can be turned-on.

A voltage level of the first node N1 can be changed according to the reference voltage Vref. A voltage of the second node N2 coupled with the first node N1 can be changed. When the driving transistor DRT is turned-on according to a voltage change of the second node N2, the driving transistor DRT can output a driving current corresponding to the data voltage Vdata.

As the driving transistor DRT is driving and the fourth switching transistor SWT4 is a state being turned-on, the light-emitting element ED can represent a luminance corresponding to the driving current.

A period that the light-emitting control signal EM of a turn-on level is supplied can be referred to as "a light-emitting period".

Such as described above, the subpixel SP can operate by the scan signal SCAN and the light-emitting control signal EM supplied through the gate line GL. A circuit supplying the scan signal SCAN and a circuit supplying the light-emitting control signal EM can be disposed as separate circuits, or can be disposed as an integrated circuit.

Figure 3:
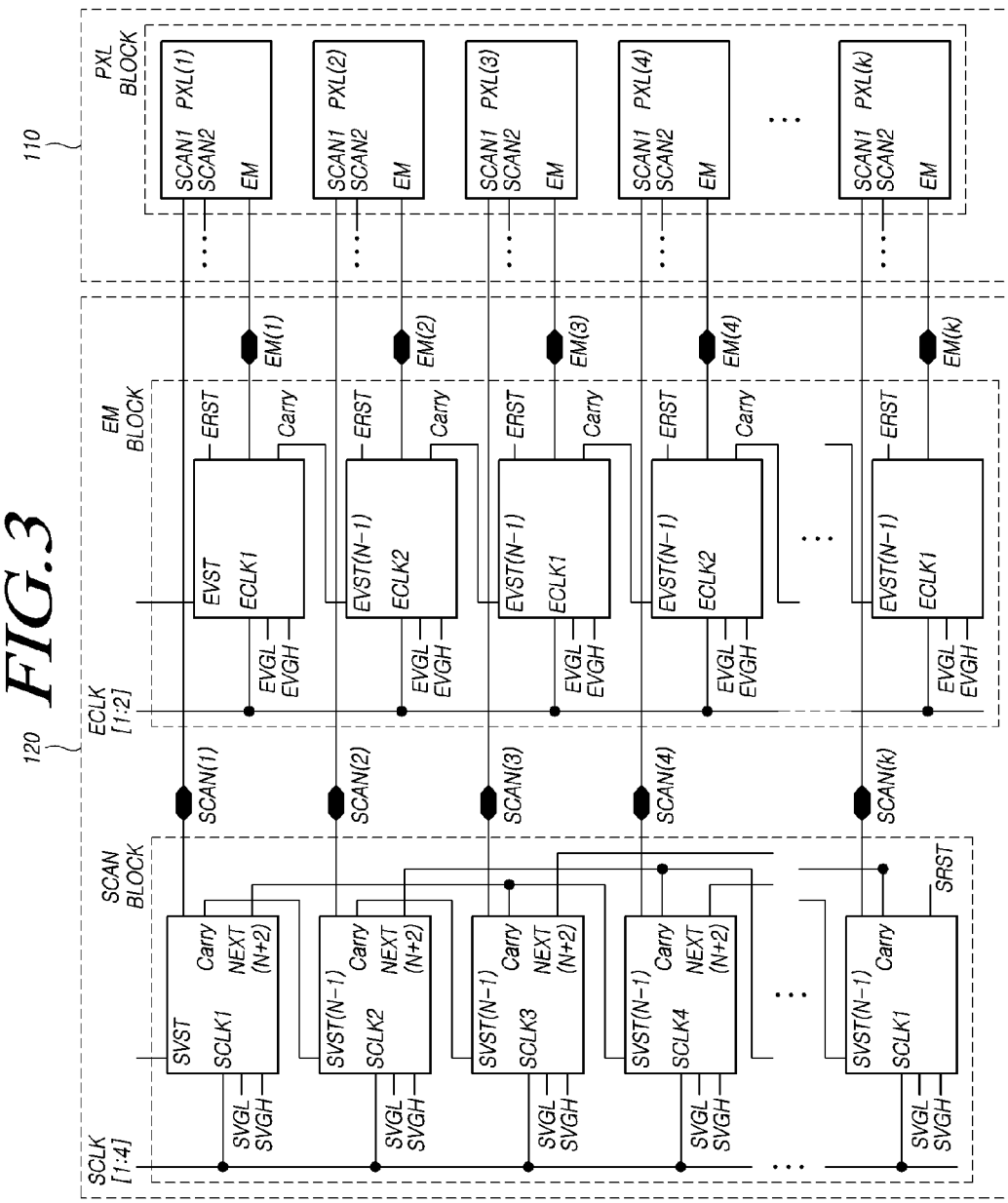
FIG. 3 is a diagram illustrating an example of a configuration of a gate driving circuit according to embodiments of the present disclosure.

FIG. 3 is a diagram illustrating an example of a configuration of the gate driving circuit 120 according to embodiments of the present disclosure.

Referring to FIG. 3, the gate driving circuit 120 can include a scan block and a light-emitting control block.

The scan block and the light-emitting control block included in the gate driving circuit 120 can be supplied various control signals (e.g., a gate start signal, a gate clock signal) and various voltages (e.g., a first gate driving voltage, a second gate driving voltage) and can be driven.

The scan block can include several circuit elements, and can be supplied various voltages and control signals and can output the scan signal SCAN to the gate line GL.

For example, the scan block can operate by being supplied a scan start signal SVST and a scan clock signal SCLK. A carry signal output at a timing which the scan block outputs the scan signal SCAN can be input as a scan start signal SVST of a next scan block. Furthermore, a signal output at a timing which the scan block outputs the scan signal SCAN can be input as a scan reset signal SRST of a previous scan block (e.g., an immediate previous scan block, or a scan block before the immediate previous scan block).

A number of the scan clock signal SCLK can be various depending on a driving method of the scan block. The scan block illustrated in FIG. 3 represents an example controlled by four scan clock signals SCLK1, SCLK2, SCLK3, SCLK4.

The scan block can be supplied a first scan driving voltage SVGL and a second scan driving voltage SVGH. The scan block can supply the scan signal SCAN which is using at least one of the first scan driving voltage SVGL or the second scan driving voltage SVGH to the subpixel SP according to timings of the scan start signal SVST and the scan clock signal SCLK.

The light-emitting control block can be driven according to a light-emitting control start signal EVST and a light-emitting control clock signal ECLK, and can output the light-emitting control signal EM to the gate line GL.

A carry signal which the light-emitting control block outputs at a timing which the light-emitting control block outputs the light-emitting control signal EM can be input as the light-emitting control start signal EVST to a next light-emitting control block. As the light-emitting control block controls a light-emitting period of the subpixel SP, a period that the light-emitting control signal EM maintains a turn-on level can be long. The light-emitting control block can terminate an output of the light-emitting control signal EM according to a light-emitting control reset signal ERST supplied separately.

A number of the light-emitting control clock signal ECLK can be various according to a driving method of the light-emitting control block. The light-emitting control block illustrated in FIG. 3 represents an example controlled by two light-emitting control clock signals ECLK1, ECLK2.

The light-emitting control block can be supplied a first light-emitting control driving voltage EVGL and a second light-emitting control driving voltage EVGH. The light-emitting control block can output the light-emitting control signal EM by using the first light-emitting control driving voltage EVGL and the second light-emitting control driving voltage EVGH in accordance with timings of the light-emitting control start signal EVST and the light-emitting control clock signal ECLK.

Such as described above, the subpixel SP can be driven by the scan signal SCAN output by the scan block and the light-emitting control signal EM output by the light-emitting control block and an image according to an image data can be displayed.

As the light-emitting control signal EM maintains a turn-on level in the light-emitting period of the subpixel SP, a ratio of a period that the light-emitting control block outputs the light-emitting control signal EM of a turn-on level in one frame period can be high.

Embodiments of the present disclosure can provide methods for stably maintaining a turn-on level of the light-emitting control signal EM which the light-emitting control block outputs in the light-emitting period of the frame period.

Figure 4:
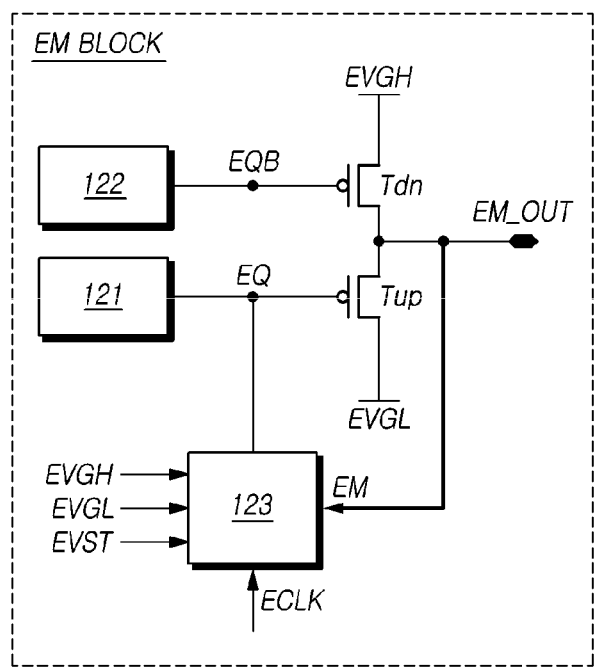
FIG. 4 is a diagram illustrating an example of a configuration of a light-emitting control block of a gate driving circuit according to embodiments of the present disclosure.

FIG. 4 is a diagram illustrating an example of a configuration of the light-emitting control block of the gate driving circuit 120 according to embodiments of the present disclosure.

Referring to FIG. 4, the light-emitting control block can include a pull-up transistor Tup, a pull-down transistor Tdn, a Q node control portion 121, a QB node control portion 122 and a pump control portion 123.

The pull-up transistor Tup can be electrically connected between an input terminal of a first light-emitting control driving voltage EVGL and an output terminal of the light-emitting control signal EM. The pull-up transistor Tup can be controlled by a voltage level of a Q node EQ. The first light-emitting control driving voltage EVGL, for example, can be a low-potential driving voltage.

The pull-up transistor Tup can control an output of the light-emitting control signal EM of a turn-on level to the gate line GL.

The pull-down transistor Tdn can be electrically connected between an input terminal of a second light-emitting control driving voltage EVGH and the output terminal of the light-emitting control signal EM. The pull-down transistor Tdn can be controlled by a voltage level of a QB node EQB. The second light-emitting control driving voltage EVGH, for example, can be a high-potential driving voltage.

The pull-down transistor Tdn can control an output of the light-emitting control signal EM of a turn-off level to the gate line GL.

The Q node control portion 121 can include various circuit elements, and can control a voltage level of the Q node EQ. The QB node control portion 122 can include various circuit elements, and can control a voltage level of the QB node EQB.

The pump control portion 123 can be electrically connected to the Q node EQ. The pump control portion 123 can be supplied at least one of the light-emitting control start signal EVST, the light-emitting control clock signal ECLK, the first light-emitting control driving voltage EVGL or the second light-emitting control driving voltage EVGH.

The pump control portion 123 can be input the light-emitting control signal EM which is output through the output terminal of the light-emitting control signal EM. The pump control portion 123 can operate according to a voltage level of the light-emitting control signal EM.

The pump control portion 123 can operate according to the light-emitting control signal EM, and can control the voltage level of the Q node EQ by using various signal and voltage input to the pump control portion 123.

The pump control portion 123, for example, can control the voltage level of the Q node EQ during a period that the light-emitting control signal EM of a turn-on level is output. The pump control portion 123 can control so that the voltage level of the Q node EQ maintains a level turning-on the pull-up transistor Tup in an output period of the light-emitting control signal EM of a turn-on level.

By the pump control portion 123, the voltage level of the Q node EQ can be maintained stably in a period that the light-emitting control signal EM of a turn-on level is output.

As the voltage level of the Q node EQ is maintained stably, even in the case that a period that the light-emitting control signal EM of a turn-on level is output is long, a supply of the light-emitting control signal EM of a turn-on level to the subpixel SP can be maintained stably.

The pump control portion 123 can include various circuit elements for controlling the voltage level of the Q node EQ according to the light-emitting control signal EM.

Figure 5:
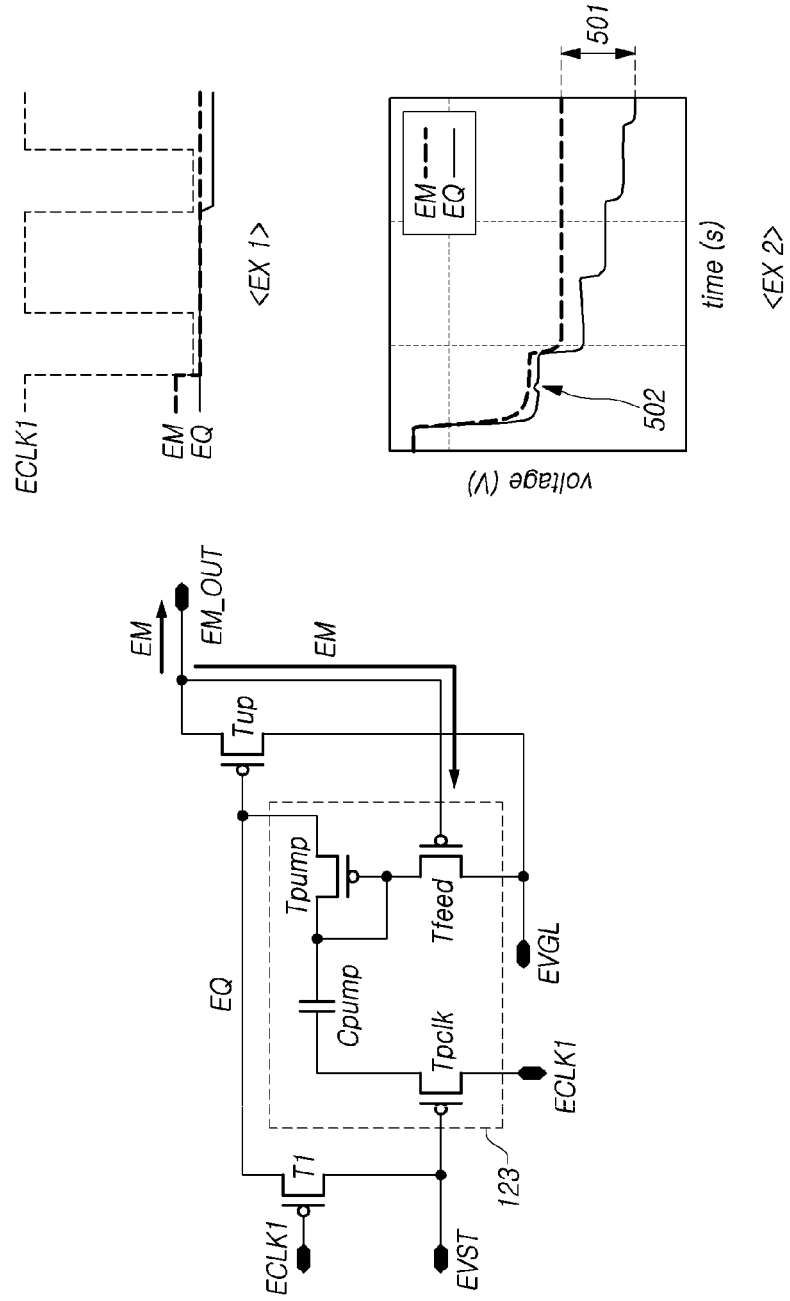
FIGS. 5 to 7 are diagrams illustrating an example of a circuit structure of a light-emitting control block of a gate driving circuit according to the embodiments of the present disclosure.
Figure 6:
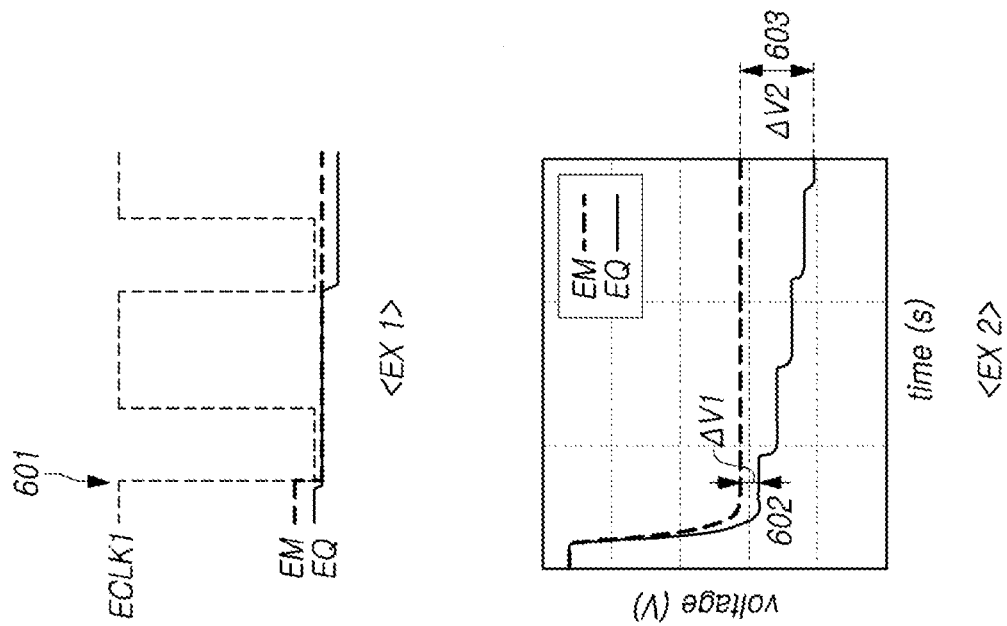
Figure 6:
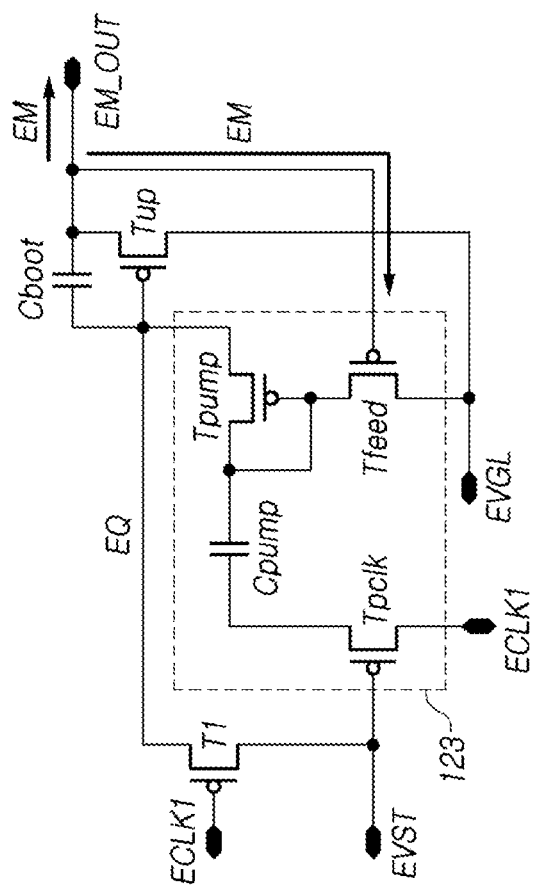
Figure 7:
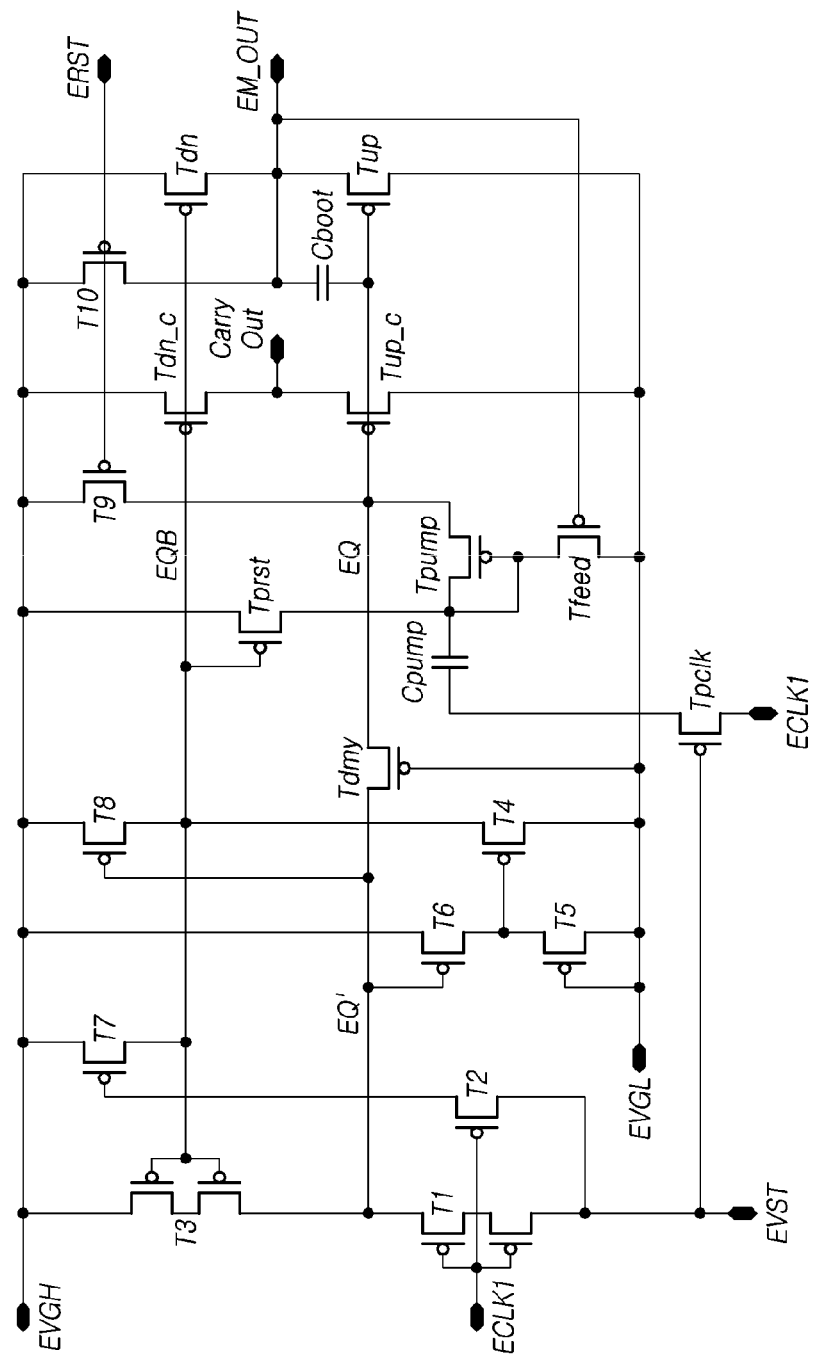
Figure 8:
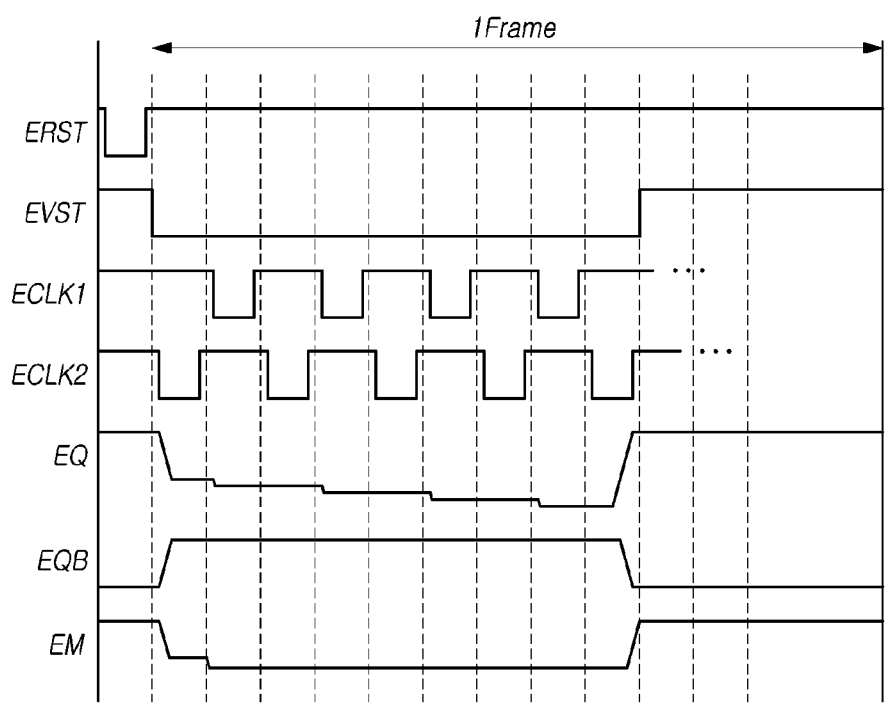
FIG. 8 is a diagram illustrating an example of a driving timing of a light-emitting control block of a gate driving circuit illustrated in FIG. 7.

FIGS. 5 to 7 are diagrams illustrating an example of a circuit structure of a light-emitting control block of the gate driving circuit 120 according to the embodiments of the present disclosure. FIG. 8 is a diagram illustrating an example of a driving timing of a light-emitting control block of the gate driving circuit 120 illustrated in FIG. 7.

Referring to FIG. 5, it illustrates the case that the light-emitting control block is controlled by a first light-emitting control clock signal ECLK1.

The pump control portion 123 included in the light-emitting control block can be electrically connected to the Q node of the light-emitting control block. The pump control portion 123 can be electrically connected to the output terminal of the light-emitting control signal EM.

The pump control portion 123 can include at least one capacitor and at least one transistor.

For example, the pump control portion 123 can include a pump capacitor Cpump, a pump transistor Tpump, a feed transistor Tfeed and a clock transistor Tpclk.

The pump capacitor Cpump can be electrically between an input terminal of the first light-emitting control clock signal ECLK1 and the Q node EQ. The pump transistor Tpump can be electrically connected between the pump capacitor Cpump and the Q node EQ. A gate node of the pump transistor Tpump can be electrically connected to a node between the pump transistor Tpump and the pump capacitor Cpump. The node between the pump transistor Tpump and the pump capacitor Cpump can be a source node of the pump transistor Tpump.

The feed transistor Tfeed can be electrically connected between the gate node of the pump transistor Tpump and the input terminal of the first light-emitting control driving voltage EVGL. A gate node of the feed transistor Tfeed can be electrically connected to the output terminal of the light-emitting control signal EM. The feed transistor Tfeed can operate according to a voltage level of the light-emitting control signal EM.

The clock transistor Tpclk can be electrically connected between the pump capacitor Cpump and the input terminal of the first light-emitting control clock signal ECLK1. The clock transistor Tpclk can operate according to a voltage level of the light-emitting control start signal EVST.

The light-emitting control start signal EVST of a turn-on level can be supplied to the light-emitting control block in a driving period of the light-emitting control block. The light-emitting control start signal EVST of a turn-on level can be supplied to the Q node EQ through a first transistor T1.

When the voltage level of the Q node EQ becomes a level turning-on the pull-up transistor Tup, the first light-emitting control driving voltage EVGL can be output to the output terminal of the light-emitting control signal EM. The light-emitting control signal EM of a turn-on level can be output.

The light-emitting control signal EM of a turn-on level can be applied to the gate node of the feed transistor Tfeed included in the pump control portion 123 simultaneously while being supplied to the gate line GL.

The feed transistor Tfeed can be turned-on by the light-emitting control signal EM of a turn-on level.

When the feed transistor Tfeed is turned-on, the first light-emitting control driving voltage EVGL can be applied to the gate node of the pump transistor Tpump. A voltage level of the first light-emitting control driving voltage EVGL can be a level turning-on the pump transistor Tpump.

As the pump transistor Tpump is turned-on, the pump capacitor Cpump can be electrically connected to the Q node EQ. The pump capacitor Cpump and the Q node EQ can be coupled.

As it is a period that the light-emitting control block is driving, the clock transistor Tpclk can be turned-on by the light-emitting control start signal EVST. The first light-emitting control clock signal ECLK1 can be applied to the pump capacitor Cpump through the clock transistor Tpclk.

The first light-emitting control clock signal ECLK1 can be a signal of a pulse shape. The first light-emitting control clock signal ECLK1 can include a first level (e.g., a low level) and a second level (e.g., a high level). The first light-emitting control clock signal ECLK1 can be a signal that the first level and the second level are alternating, and a summation of a period being the first level and a period being the second level can be referred to as one cycle.

A level of the first light-emitting control clock signal ECLK1 can be changed several times during a period that the light-emitting control start signal EVST is a turn-on level. When a level of the first light-emitting control clock signal ECLK1 is changed, since the pump capacitor Cpump is coupled to the Q node EQ, the voltage level of the Q node EQ can be fluctuated.

For example, referring to an example illustrated in <EX 1> of FIG. 5, when the first light-emitting control clock signal ECLK1 is changed from the low level to the high level, since the pump transistor Tpump whose gate node and source node are electrically connected to each other is positioned between the pump capacitor Cpump and the Q node EQ, the voltage level of the Q node EQ can be maintained without fluctuating.

When the first light-emitting control clock signal ECLK1 is changed from the high level to the low level, since a current toward the pump capacitor Cpump through the pump transistor Tpump can flow, the voltage level of the Q node EQ can be lowered.

By a structure that the pump capacitor Cpump and the pump transistor Tpump are electrically connected between the first light-emitting control clock signal ECLK1 and the Q node EQ, the voltage level of the Q node EQ can be lowered when the first light-emitting control clock signal ECLK1 is changed from the high level to the low level.

The voltage level of the Q node EQ can maintain a level turning-on the pull-up transistor Tup stably during a period that the light-emitting control block outputs the light-emitting control signal EM of a turn-on level.

As the voltage level of the Q node EQ can be lowered in accordance with a cycle of the first light-emitting control clock signal ECLK1, a difference between the voltage level of the Q node EQ and a level turning-on the pull-up transistor Tup can increase gradually in a period that the light-emitting control signal EM of a turn-on level is output.

For example, referring to an example illustrated in <EX 2> of FIG. 5, the voltage level of the Q node EQ can be lowered at a timing that the light-emitting control signal EM of a turn-on level is output. The voltage level of the Q node EQ can be lowered gradually in a period that an output of the light-emitting control signal EM of a turn-on level is maintained such as a portion indicated by 501.

As the voltage level of the Q node EQ maintains a low level stably during a period that the light-emitting control signal EM of a turn-on level is output, the light-emitting control signal EM of a turn-on level by the light-emitting control block can be output stably.

Meanwhile, a voltage level control of the Q node EQ by the pump capacitor Cpump may not perform at a timing that the light-emitting control signal EM of a turn-on level obtained by the light-emitting control start signal EVST is output. Such as a portion indicated by 502, the voltage level of the Q node EQ may not be low sufficiently.

Embodiments of the present disclosure, in a structure that the light-emitting control block includes the pump control portion 123, by sufficiently lowering the voltage level of the Q node EQ at a timing that the light-emitting control signal EM of a turn-on level is output, can maintain the voltage level of the Q node EQ entirely stably during a driving period of the light-emitting control block.

Referring to FIG. 6, the light-emitting control block can include the pump control portion 123 electrically connected to the Q node EQ and operating according to the light-emitting control signal EM. The light-emitting control block can include a boot capacitor Cboot electrically connected between the Q node EQ and the output terminal of the light-emitting control signal EM.

The Q node EQ can be coupled to the output terminal of the light-emitting control signal EM by the boot capacitor Cboot. The voltage level of the Q node EQ can be fluctuated in accordance with a fluctuation of a voltage level of the output terminal of the light-emitting control signal EM.

For example, referring to an example illustrated in <EX 1> of FIG. 6, such as a portion indicated by 601, the voltage level of the Q node EQ can be lowered by the boot capacitor Cboot at a timing that the light-emitting control signal EM of a turn-on level is output while a level of the light-emitting control signal EM is lowering.

The voltage level of the Q node EQ can be lowered by the pump capacitor Cpump in accordance with the cycle of the first light-emitting control clock signal ECLK1 during a period that the light-emitting control signal EM of a turn-on level is maintained.

In an example illustrated in <EX 2> of FIG. 6, such as a portion indicated by 602, a first difference ($\Delta V1$) between the voltage level of the Q node EQ and the voltage level of the light-emitting control signal EM can be obtained at a timing that the light-emitting control signal EM of a turn-on level is output. After then, such as a portion indicated by 603, the pump capacitor Cpump can operate according to the first light-emitting control clock signal ECLK1 and the voltage level of the Q node EQ can be lowered, thus a second difference($\Delta V2$) between the voltage level of the Q node EQ and the voltage level of the light-emitting control signal EM, which is greater than first difference($\Delta V1$), can be obtained at a timing that the light-emitting control signal EM of a turn-on level is maintained. Therefore, a difference between the voltage level of the Q node EQ and the voltage level of the light-emitting control signal EM can gradually increase at a timing that the light-emitting control signal EM is turn-on level.

A size that the voltage level of the Q node EQ is lowered at a timing that the light-emitting control signal EM of a turn-on level is output can be greater than a size that the voltage level of the Q node EQ is lowered in accordance with the cycle of the first light-emitting control clock signal ECLK1.

The voltage level of the Q node EQ can be lowered sufficiently by the boot capacitor Cboot at a timing that the light-emitting control signal EM of a turn-on level is output.

The voltage level of the Q node EQ can be maintained as a sufficiently low voltage level by the pump capacitor Cpump during a period that the output of the light-emitting control signal EM of a turn-on level is maintained.

The level of the light-emitting control signal EM that the light-emitting control block outputs can be maintained stably during the light-emitting period of the subpixel SP.

FIG. 7 illustrates a specific example of a circuit structure of the light-emitting control block including the pump control portion 123 above-mentioned. FIG. 8 illustrates an example of a driving timing of the light-emitting control block illustrated in FIG. 7.

Referring to FIGS. 7 and 8, the light-emitting control block can include a plurality of transistors T1, T2, T3, T4, T5, T6, T7, T8, T9, T10, Tup_c, Tdn_c, Tdmy, Tpump, Tfeed, Tpclk, Tprst and at least one capacitor Cpump, Cboot other than the pull-up transistor Tup and the pull-down transistor Tdn.

A first transistor T1 can be electrically connected between an input terminal of the light-emitting control start signal EVST and a Q' node EQ'. The first transistor T1 can operate according to a voltage level of the first light-emitting control clock signal ECLK1.

A second transistor T2 can be electrically connected between the input terminal of the light-emitting control start signal EVST and a gate node of a seventh transistor T7. The second transistor T2 can operate according to the voltage level of the first light-emitting control clock signal ECLK1.

A third transistor T3 can be electrically connected between an input terminal of the second light-emitting control driving voltage EVGH and the Q' node EQ'. The third transistor T3 can operate according to the voltage level of the QB node EQB.

A fourth transistor T4 can be electrically connected between an input terminal of the first light-emitting control driving voltage EVGL and the QB node EQB. The fourth transistor T4 can operate according to a voltage level of a node between a fifth transistor T5 and a sixth transistor T6.

The fifth transistor T5 and the sixth transistor T6 can be electrically connected between the input terminal of the first light-emitting control driving voltage EVGL and the input terminal of the second light-emitting control driving voltage EVGH. The fifth transistor T5 can operate according to the voltage level of the first light-emitting control driving voltage EVGL. The sixth transistor T6 can operate according to a voltage level of the Q' node EQ'.

The seventh transistor T7 and a eighth transistor T8 can be electrically connected between the input terminal of the second light-emitting control driving voltage EVGH and the QB node EQB. The seventh transistor T7 can operate according to a signal supplied through the second transistor T2. The eighth transistor T8 can operate according to the voltage level of the Q' node EQ'.

A ninth transistor T9 can be electrically connected between the input terminal of the second light-emitting control driving voltage EVGH and the Q node EQ. A tenth transistor T10 can be electrically connected between the input terminal of the second light-emitting control driving voltage EVGH and the output terminal of the light-emitting control signal EM. The ninth transistor T9 and the tenth transistor T10 can operate according to a light-emitting control reset signal ERST.

A pull-up transistor Tup_c and a pull-down transistor Tdn_c for an output of a carry signal can be disposed in the light-emitting control block separately from the pull-up transistor Tup and the pull-down transistor Tdn for an output of the light-emitting control signal EM. A dummy transistor Tdmy can be electrically connected between the Q' node EQ' and the Q node EQ.

The boot capacitor Cboot can be electrically connected between the Q node EQ and the output terminal of the light-emitting control signal EM.

The pump capacitor Cpump can be electrically connected between the Q node EQ and the input terminal of the first light-emitting control clock signal ECLK1.

The pump transistor Tpump can be electrically connected between the pump capacitor Cpump and the Q node EQ. The pump transistor Tpump can operate according to a signal supplied through the feed transistor Tfeed.

The feed transistor Tfeed can be electrically connected between the gate node of the pump transistor Tpump and the input terminal of the first light-emitting control driving voltage EVGL. The feed transistor Tfeed can operate according to the voltage level of the light-emitting control signal EM.

The clock transistor Tpclk can be electrically connected between the pump capacitor Cpump and the input terminal of the first light-emitting control clock signal ECLK1. The clock transistor Tpclk can operate according the voltage level of the light-emitting control start signal EVST.

A reset transistor Tprst can be electrically connected between the input terminal of the second light-emitting control driving voltage EVGH and the pump capacitor Cpump. The reset transistor Tprst can be electrically connected to the gate node of the pump transistor Tpump. The reset transistor Tprst can operate according to the voltage level of the QB node EQB.

When the light-emitting control reset signal ERST of a turn-on level is supplied, the ninth transistor T9 and the tenth transistor T10 can be turned-on, and the second light-emitting control driving voltage EVGH can be supplied to the Q node EQ and the output terminal of the light-emitting control signal EM. The Q node EQ can be maintained as the high level, the QB node EQB can be maintained as the low level, and the light-emitting control signal EM of a turn-off level can be output.

The light-emitting control start signal EVST of a turn-on level can be supplied to the light-emitting control block in a frame period.

The level of the Q node EQ can be changed to the low level. The level of the QB node EQB can be changed to the high level. As the level of the Q node EQ is changed to the low level, the pull-up transistor Tup can be turned-on.

The first light-emitting control driving voltage EVGL can be output to the output terminal of the light-emitting control signal EM through the pull-up transistor Tup. The light-emitting control signal EM of a turn-on level can be output. The voltage level of the Q node EQ can be lowered according to the output of the light-emitting control signal EM of a turn-on level by the boot capacitor Cboot.

The feed transistor Tfeed can be turned-on during a period that the light-emitting control signal EM of a turn-on level is output. As the feed transistor Tfeed is a turn-on state, the first light-emitting control driving voltage EVGL can be applied to the gate node of the pump transistor Tpump. The pump transistor Tpump can maintain a turn-on state during a period that the light-emitting control signal EM of a turn-on level is output.

The clock transistor Tpclk can be a turn-on state during a period that the light-emitting control start signal EVST of a turn-on level is supplied.

As the clock transistor Tpclk is a turn-on state, the voltage level of the Q node EQ electrically connected to the pump capacitor Cpump can be fluctuated according to the first light-emitting control clock signal ECLK1. The voltage level of the Q node EQ can be lowered in accordance with the cycle of the first light-emitting control clock signal ECLK1. The voltage level of the Q node EQ can maintain a level turning-on the pull-up transistor Tup stably during a period that the light-emitting control signal EM of a turn-on level is output. The output of the light-emitting control signal EM of a turn-on level can be maintained stably during the light-emitting period of the subpixel SP.

The light-emitting control start signal EVST can be changed to a turn-off level at a timing that the light-emitting period is terminated.

The voltage level of the Q node EQ can be changed to the high level, and the voltage level of the QB node EQB can be changed to the low level. The pull-up transistor Tup can be turned-off, and the pull-down transistor Tup can be turned-on. The second light-emitting control driving voltage EVGH can be output to the output terminal of the light-emitting control signal EM through the pull-down transistor Tdn. The light-emitting control signal EM of a turn-off level can be supplied to the subpixel SP.

The reset transistor Tprst can be turned-on according to the voltage level of the QB node EQB. The second light-emitting control driving voltage EVGH can be supplied to the gate node of the pump transistor Tpump through the reset transistor Tprst. The pump transistor Tpump can be turned-off.

As the light-emitting control signal EM of a turn-off level is applied to the gate node of the feed transistor Tfeed, the feed transistor Tfeed can be turned-off. As the light-emitting control start signal EVST of a turn-off level is supplied, the clock transistor Tpclk can be turned-off.

The pump capacitor Cpump may not operate during a period that the light-emitting control signal EM of a turn-off level is output.

Such as described above, the voltage level of the Q node EQ can be maintained stably through the pump control portion 123 operating by the light-emitting control signal EM during a period that the light-emitting control signal EM of a turn-on level is output.

By stably maintaining the output of the light-emitting control signal EM which is output during a period of a long ratio of the frame period, a driving characteristic of the subpixel SP emitting a light according to the output signal of the light-emitting control block can be improved.

Some embodiments of the present disclosure described above will be briefly described as follows.

A display device 100 according to embodiments of the present disclosure can include a display panel 110 in which a plurality of subpixels SP are disposed, a plurality of gate lines GL electrically connected to at least one of the plurality of subpixels SP, and a gate driving circuit 120 outputting a gate signal to the plurality of gate lines GL.

The gate driving circuit 120 can include a pull-up transistor Tup controlled by a voltage level of a Q node, a pull-down transistor Tdn controlled by a voltage level of a QB node, a pump capacitor Cpump electrically connected between the Q node and an input terminal of a gate clock signal, and a pump transistor Tpump electrically connected between the pump capacitor Cpump and the Q node and controlled by the gate signal output to the gate line GL.

A gate node of the pump transistor Tpump can be electrically connected to a node between the pump transistor Tpump and the pump capacitor Cpump.

In a period that the pump transistor Tpump is turned-on, the voltage level of the Q node can be maintained when a level of the gate clock signal is changed from a first level to a second level. The voltage level of the Q node can be changed when the level of the gate clock signal is changed from the second level to the first level.

In a period that the pump transistor Tpump is turned-on, a difference between the voltage level of the Q node and a voltage level turning-on the pull-up transistor Tup can increase.

The gate driving circuit 120 can include a feed transistor Tfeed electrically connected between a gate node of the pump transistor Tpump and an input terminal of a first gate driving voltage and controlled by a voltage level of the gate signal output to the gate line GL.

A level of the first gate driving voltage can be a level turning-on the pump transistor Tpump.

The gate driving circuit 120 can include a clock transistor Tpclk electrically connected between the pump capacitor Cpump and the input terminal of the gate clock signal and controlled by a voltage level of a gate start signal.

A voltage level of the gate clock signal can be changed several times in a period that the voltage level of the gate start signal is a level turning-on the clock transistor Tpclk.

The voltage level of the Q node can be changed in accordance with a cycle of the gate clock signal in a period that the voltage level of the gate start signal is a level turning-on the clock transistor Tpclk.

The gate driving circuit 120 can include a reset transistor Tprst electrically connected between a gate node of the pump transistor Tpump and an input terminal of a second gate driving voltage and controlled by the voltage level of the QB node.

A level of the second gate driving voltage can be a level turning-off the pump transistor Tpump.

The gate driving circuit 120 can include a boot capacitor Cboot electrically connected between the Q node and an output terminal of the gate signal.

Each of the plurality of subpixels SP can include a light-emitting element ED, a driving transistor DRT supplying a driving current to the light-emitting element ED, and a plurality of switching transistors SWT controlling a driving timing of the driving transistor DRT and the light-emitting element ED.

The above-mentioned gate signal can be a signal supplied for controlling the switching transistor SWT having the longest turn-on period in a frame period among the plurality of switching transistors SWT.

A display device 100 according to embodiments of the present disclosure can include a plurality of subpixels SP disposed in a display panel 110, a first gate driving circuit outputting a first gate signal to the plurality of subpixels SP, and a second gate driving circuit outputting a second gate signal to the plurality of subpixels SP.

In one frame period, a period that the second gate signal is a turn-on level can be greater than a period that the first gate signal is a turn-on level.

The second gate driving circuit can include a pump control portion 123 electrically connected between a Q node and an input terminal of a gate clock signal and controlled by a voltage level of the second gate signal.

The pump control portion 123 can operate in a period that the second gate signal is a turn-on level.

The pump control portion 123 can include a pump capacitor Cpump electrically connected to the input terminal of the gate clock signal. The pump capacitor Cpump can be electrically connected to the Q node in a period that the second gate signal is a turn-on level.

A gate driving circuit 120 according to embodiments of the present disclosure can include a pull-up transistor Tup controlled by a voltage level of a Q node and electrically connected between an input terminal of a first gate driving voltage and an output terminal of a gate signal, a pull-down transistor Tdn controlled by a voltage level of a QB node and electrically connected between an input terminal of a second gate driving voltage and the output terminal of the gate signal, a pump capacitor Cpump electrically connected between the Q node and an input terminal of a gate clock signal, a pump transistor Tpump electrically connected between the pump capacitor Cpump and the Q node, and a feed transistor Tfeed electrically connected between a gate node of the pump transistor Tpump and the input terminal of the first gate driving voltage and controlled by a voltage level of the gate signal.

The gate driving circuit 120 can include a boot capacitor Cboot electrically connected between the Q node and the output terminal of the gate signal.

A size that the voltage level of the Q node is changed at a timing that the gate signal is changed from a turn-off level to a turn-on level can be greater than a size that the voltage level of the Q node is changed in accordance with a cycle of the gate clock signal.

The above description has been presented to enable any person skilled in the art to make and use the technical idea of the present disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present disclosure. The above description and the accompanying drawings provide an example of the technical idea of the present disclosure for illustrative purposes only. That is, the disclosed embodiments are intended to illustrate the scope of The technical idea of the present disclosure. Thus, the scope of the present disclosure is not limited to the embodiments shown. The scope of protection of the present disclosure should be construed based on the following claims, and all technical ideas within the scope of equivalents thereof should be construed as being included within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
   a display panel in which a plurality of subpixels is disposed;
   a gate line electrically connected to at least one of the plurality of subpixels; and
   a gate driving circuit outputting a gate signal to the gate line,
   wherein the gate driving circuit comprising:
   a pull-up transistor controlled by a voltage level of a Q node;
   a pull-down transistor controlled by a voltage level of a QB node;
   a pump capacitor electrically connected between the Q node and an input terminal of a gate clock signal; and
   a pump transistor electrically connected between the pump capacitor and the Q node, and controlled by the gate signal output to the gate line,
   wherein in a period that the pump transistor is turned-on, a difference between the voltage level of the Q node and a voltage level of a light-emitting control signal increases, and
   wherein the gate signal is the light-emitting control signal.

2. The display device of claim 1, wherein a gate node of the pump transistor is electrically connected to a node between the pump transistor and the pump capacitor.

3. The display device of claim 1, wherein in a period that the pump transistor is turned-on, the voltage level of the Q node is maintained when a level of the gate clock signal is changed from a first level to a second level, and the voltage level of the Q node is changed when the level of the gate clock signal is changed from the second level to the first level.

4. The display device of claim 3, wherein a gate node of the pump transistor is electrically connected to a node between the pump transistor and the pump capacitor, and the pump transistor is a P type transistor, and
   wherein the second level is higher than the first level.

5. The display device of claim 3, wherein in a period that the pump transistor is turned-on, a voltage level of the gate clock signal is changed several times.

6. The display device of claim 1, wherein the pull-up transistor is a P type transistor, and in a period that the pump transistor is turned-on, the voltage level of the Q node is smaller than the voltage level turning-on the pull-up transistor.

7. The display device of claim 1, wherein the gate driving circuit further comprising:
   a feed transistor electrically connected between a gate node of the pump transistor and an input terminal of a first gate driving voltage, and controlled by a voltage level of the gate signal output to the gate line.

8. The display device of claim 7, wherein a level of the first gate driving voltage is a level turning-on the pump transistor.

9. The display device of claim 1, wherein the gate driving circuit further comprising:
   a clock transistor electrically connected between the pump capacitor and the input terminal of the gate clock signal, and controlled by a voltage level of a gate start signal.

10. The display device of claim 9, wherein a voltage level of the gate clock signal is changed several times in a period that the voltage level of the gate start signal is a level turning-on the clock transistor.

11. The display device of claim 9, wherein the voltage level of the Q node is changed in accordance with a cycle of the gate clock signal in a period that the voltage level of the gate start signal is a level turning-on the clock transistor.

12. The display device of claim 1, wherein the gate driving circuit further comprising:
   a reset transistor electrically connected between a gate node of the pump transistor and an input terminal of a second gate driving voltage, and controlled by the voltage level of the QB node.

13. The display device of claim 12, wherein a level of the second gate driving voltage is a level turning-off the pump transistor.

14. The display device of claim 1, wherein the gate driving circuit further comprising:
   a boot capacitor electrically connected between the Q node and an output terminal of the gate signal.

15. The display device of claim 14, wherein a size that the voltage level of the Q node is changed at a timing that the gate signal is changed from a turn-off level to a turn-on level is greater than a size that the voltage level of the Q node is changed in accordance with a change of the gate clock signal.

16. The display device of claim 1, wherein each of the plurality of subpixels comprising:
   a light-emitting element;
   a driving transistor supplying a driving current to the light-emitting element; and
   a plurality of switching transistors controlling a driving timing of the driving transistor and the light-emitting element,
   wherein the gate signal is supplied for controlling the switching transistor having the longest turn-on period in a frame period among the plurality of switching transistors.

17. A gate driving circuit, comprising:
   a pull-up transistor controlled by a voltage level of a Q node, and electrically connected between an input terminal of a first gate driving voltage and an output terminal of a gate signal;
   a pull-down transistor controlled by a voltage level of a QB node, and electrically connected between an input terminal of a second gate driving voltage and the output terminal of the gate signal;

a pump capacitor electrically connected between the Q node and an input terminal of a gate clock signal;

a pump transistor electrically connected between the pump capacitor and the Q node; and a feed transistor electrically connected between a gate node of the pump transistor and the input terminal of the first gate driving voltage, and controlled by a voltage level of the gate signal, wherein in a period that the pump transistor is turned-on, a difference between the voltage level of the Q node and a voltage level of the light-emitting control signal increases, and wherein the gate signal is the light-emitting control signal.

* * * * *